United States Patent
Binder et al.

(10) Patent No.: US 7,836,418 B2
(45) Date of Patent: Nov. 16, 2010

(54) METHOD AND SYSTEM FOR ACHIEVING POWER OPTIMIZATION IN A HIERARCHICAL NETLIST

(75) Inventors: William A. Binder, Morrisville, NC (US); Christopher J. Gonzalez, Shelburne, VT (US); Paul D. Kartschoke, Williston, VT (US); Sherwin C. Murphy, Jr., Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 275 days.

(21) Appl. No.: 12/053,923

(22) Filed: Mar. 24, 2008

(65) Prior Publication Data
US 2009/0241079 A1 Sep. 24, 2009

(51) Int. Cl.
G06F 9/45 (2006.01)
G06F 17/50 (2006.01)

(52) U.S. Cl. .............. 716/6; 716/4; 716/5; 703/19
(58) Field of Classification Search ............... 716/4–6; 703/19
See application file for complete search history.

(56) References Cited

U.S. PATENT DOCUMENTS

| | | | |
|---|---|---|---|
| 6,427,226 B1 | 7/2002 | Mallick et al. | |
| 7,003,747 B2 | 2/2006 | Zhou et al. | |
| 7,093,208 B2 | 8/2006 | Williams et al. | |
| 7,441,211 B1 * | 10/2008 | Gupta et al. | 716/2 |
| 2004/0230921 A1 | 11/2004 | Hathaway et al. | |
| 2006/0048085 A1 * | 3/2006 | Tyler et al. | 716/6 |

* cited by examiner

*Primary Examiner*—Jack Chiang
*Assistant Examiner*—Nha T Nguyen
(74) *Attorney, Agent, or Firm*—Richard Kotulak; Roberts Mlotkowski Safran & Cole

(57) ABSTRACT

The invention generally relates to integrated circuit design, and more particularly to systems and methods for providing power optimization in a hierarchical netlist. A method includes generating a hierarchical netlist of the design, wherein the design includes a plurality of macros. The method also includes determining the timing slack of each path of the design. For each pin of each one of the plurality of macros, the method includes: determining the worst timing path; determining the slack value of the worst timing path; determining the subset of macros of the plurality of macros associated with the worst timing path; determining an apportionment parameter for each one of the subset of macros; determining a distribution of the slack amongst the subset of macros based upon the respective apportionment parameters; and adjusting timing assertions for each one of the subset of macros based upon the distribution of the slack.

4 Claims, 2 Drawing Sheets

METHOD AND SYSTEM FOR ACHIEVING POWER OPTIMIZATION IN A HIERARCHICAL NETLIST

FIELD OF THE INVENTION

The invention generally relates to integrated circuit design, and more particularly to systems and methods for providing power optimization in a hierarchical netlist.

BACKGROUND OF THE INVENTION

Power dissipation in circuits is a concern of integrated circuit (IC) designers and manufacturers. One of the effects of higher densities of devices (e.g., transistors) on chips is that more heat is being generated. Often, such increases in heat require improvements in cooling, which are costly to implement.

Currently, most integrated circuits are optimized to achieve high operational speeds. During the design process, computer aided design tools are utilized to design, simulate, and analyze circuits. Typically, all of the components of the IC and interconnections between the components are described in a netlist. Timing analysis tools utilize the netlist to simulate the propagation of signals through the various paths of the design, such that timing of the circuit can be analyzed and optimized. In performing conventional timing analysis, the time for a signal to propagate along a path is measured. When the actual arrival time of the signal at a point differs from the required arrival time of the signal at the same point, there is said to be slack. Positive slack implies that the signal traveled faster than required, while negative slack means that the signal traveled slower than desired.

One such method for analysis and optimization is the hierarchical design methodology in which the circuit is partitioned into macros. Relationships between respective macros are defined by timing assertions, which are constraints between the macros that operate to maintain overall timing and functionality of the circuit. For example, timing assertions commonly define a time at which an input signal arrives at a pin of a macro, a time at which an output signal is required at a pin of a macro, the external capacitive load driven by the outputs, etc. Optimization typically involves altering the design of a macro (e.g., logic re-structuring, layout of the components, buffer insertion, transistor sizing, etc.) to comply with the timing assertions. However, conventional timing assertions normally focus only on timing, without tuning the circuit for power.

Accordingly, there exists a need in the art to overcome the deficiencies and limitations described hereinabove.

SUMMARY OF THE INVENTION

In a first aspect of the invention, there is a method for generating a new set of timing assertions associated with a design of a circuit. The method includes generating a hierarchical netlist of the design, wherein the design includes a plurality of macros. The method also includes determining the timing slack of each path of the design.

For each pin of each one of the plurality of macros, the method includes: determining the worst timing path; determining the slack value of the worst timing path; determining the subset of macros of the plurality of macros associated with the worst timing path; determining an apportionment parameter for each one of the subset of macros; determining a distribution of the slack amongst the subset of macros based upon the respective apportionment parameters; and adjusting timing assertions for each one of the subset of macros based upon the distribution of the slack.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF EMBODIMENTS OF THE INVENTION

The invention generally relates to integrated circuit design, and more particularly to systems and methods for providing power optimization in a hierarchical netlist. For example, aspects of the invention may be used to generate (e.g., determine) modified timing assertions for a hierarchical netlist based upon an apportionment of slack between macros. By apportioning slack based upon parameters that have an effect on power (e.g., consumption, dissipation, etc.), the modified timing assertions can be used to optimize the circuit for both timing and power, instead of just timing.

Figure 1:
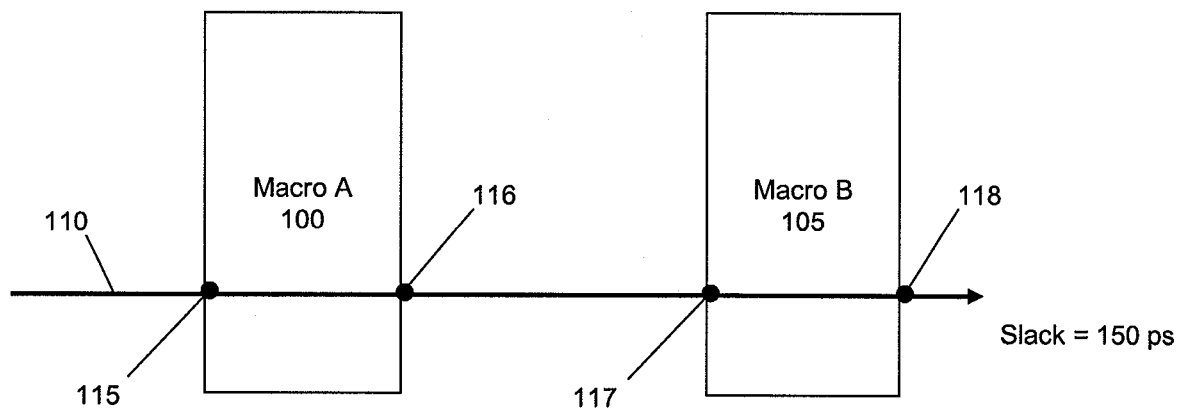
FIG. 1 shows a block diagram illustrating exemplary aspects of the invention.

FIG. 1 is a schematic block diagram that illustrates exemplary aspects of the invention. In FIG. 1, macro A 100 and macro B 105 represent macros of a hierarchical netlist of a circuit design. Path 110 represents a signal path, defined in the netlist, passing through the macros 100, 105. Reference numerals 115, 116, 117, and 118 represent inputs and outputs of the path 110 at the macros 100, 105. Timing assertions (e.g., design constraints) may be associated with the inputs and outputs 115-118 to maintain a proper timing relationship between the macros 100, 105.

In performing conventional timing analysis, the time for a signal to propagate along path 110 is measured. When the actual arrival time of the signal at a point (e.g., output 118) differs from the required (e.g., design) arrival time of the signal at the same point, there is said to be slack. Positive slack implies that the signal traveled faster than required, while negative slack means that the signal traveled slower than desired.

In embodiments of the invention, when positive slack is detected along a path, that positive slack is apportioned amongst the macros of the path based upon parameters of the macros that are related to power qualities of the circuit. The apportioned slack is distributed amongst the macros to adjust the timing assertions of the macros. The adjusted timing assertions can be used in the iterative design process to alter the physical design of each respective macro (e.g., logic re-structuring, layout of the components, buffer insertion, transistor sizing, etc.), such that the resulting circuit is optimized for both power and timing.

According to aspects of the invention, the parameters that apportionment may be based upon include, but are not limited to: total gate width (e.g., sum of all transistor gate widths within a macro) per macro in the timing path; total physical size (e.g., area) per macro in the timing path; number of timing paths per macro in the timing path; activity factors (e.g., frequency of switching from a high to low state) per macro in the timing path; power rules (e.g., amount of power actually consumed) per macro in the timing path; power contracts (e.g., amount of power budgeted) per macro in the timing path; number of high threshold voltage (or low threshold voltage) transistors per macro in the timing path; amount of positive slack attributable to each macro in the timing path; and fanout per macro pin in the timing path.

For example, in the example depicted in FIG. 1, the positive slack is 150 ps, macro A 100 has a total gate width of 70 nm, and macro B 105 has a total gate width of 30 nm. In an exemplary implementation of the invention, the positive slack would be apportioned between macro A 100 and macro B 105 based upon the values of the total gate width per macro. In this example, 70% of the slack (e.g., 105 ps) is apportioned to macro A 100 and 30% of the slack (e.g., 45 ps) is apportioned to macro B 105, since macro A 100 accounts for 70% of the total gate width and macro B 105 accounts for 30% of the total gate width of the macros in the timing path.

In embodiments, after the apportionment per macro is determined, the apportioned slack is distributed to the respective macros and the timing assertions of the macros are adjusted. For example, in FIG. 1, the timing assertion at output 116 may be relaxed by 105 ps, and the timing assertion at output 118 may be relaxed by 45 ps. In this manner, when physical aspects of the circuit are changed in the next design iteration, the relaxed timing assertions on each macro will allow the macros to be tuned for better (e.g., lower) power performance, while still maintaining the required timing performance and functionality.

While FIG. 1 has been described with respect to two macros, the invention is not limited to this number, and any number of macros may be present on a timing path. As such, positive slack may be apportioned to more than two macros on a timing path. Moreover, while only a single timing path is described, it is understood that macros in a hierarchical netlist may have any number of timing paths (e.g., thousands), and apportionment of slack and adjustment of timing assertions according to aspects of the invention may be performed for any desired path (or plurality of paths) of a hierarchical netlist.

Furthermore, the invention is not limited to the linear proportionality used to describe the apportionment of slack between macro A and macro B above, but rather any desired mathematical relationship between the parameters of the respective macros may be used to apportion the slack amongst the macros within the scope of the invention. Moreover, while FIG. 1 is described with respective to positive slack, implementations of the invention may also be used for apportioning negative slack based upon the same parameters.

PROCESSES OF THE INVENTION

Figure 2:
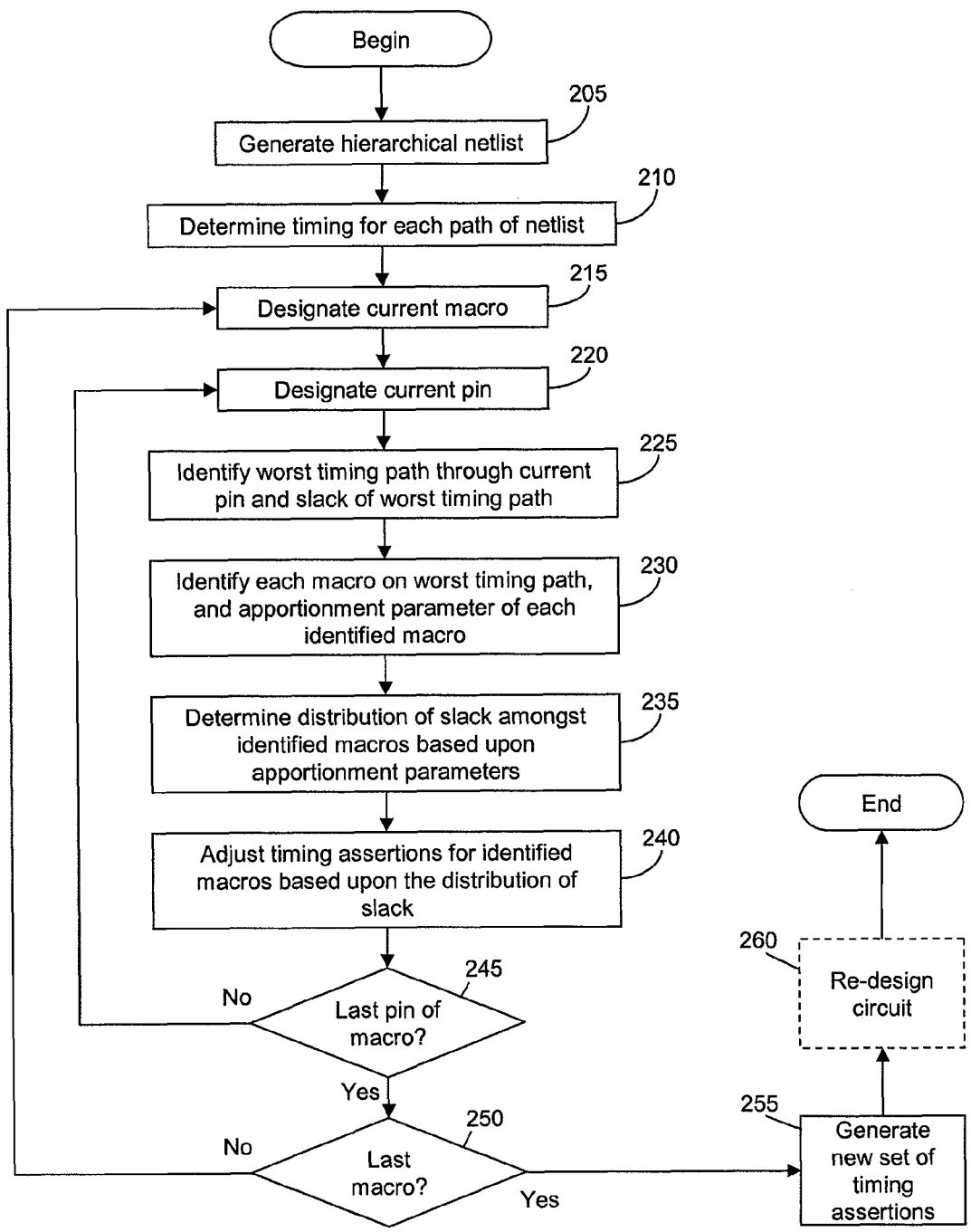
FIG. 2 shows a flow diagram depicting implementations of a method according to aspects of the invention.

FIG. 2 is a flow diagram showing steps of a method according to aspects of the invention. The flow diagram may equally represent a high-level block diagram of the invention. The steps of the flow diagram may be implemented and executed from a server, in a client-server relationship, by computing devices in an ad hoc network, or they may run on a user workstation with operative information conveyed to the user workstation. Additionally, the invention can take the form of an entirely hardware embodiment, an entirely software embodiment or an embodiment containing both hardware and software elements. In an embodiment, the software elements include firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

At step 205, a hierarchical netlist is generated for the circuit design. In embodiments, this is performed using a conventional design tool executing on a computing device. The netlist includes, amongst other information, data regarding macros and timing paths that pass through the macros. At step 210, a conventional timing analysis tool is used to determine the timing slack for each path of the netlist.

At step 215, the method (e.g., via a computer program product) begins an iterative process by advancing to the next macro in the netlist. For example, the computer program product obtains data associated with the macros from the netlist, and designates one of the macros as the current macro for processing.

At step 220, the computer program product advances to the next pin of the current macro designated in step 215. For example, a macro may have hundreds of pins as defined in the netlist, and the computer program product designates one of the pins as the current pin for processing.

At step 225, the computer program product identifies the worst (e.g., longest, slowest, least amount of positive slack, etc.) timing path that passes through the current pin (designated in step 220). Also in step 255, the slack for this timing path is determined. Data for identifying (e.g., determining) the worst timing path and the slack is available from step 210.

At step 230, the computer program product identifies (e.g., determines) each macro on the worst timing path. Also in step 230, the apportionment parameter of each macro on the timing path is determined. For example, the computer program product may sum the gate width of all of the gates in each macro to obtain a total gate width for each macro on the timing path (e.g., as described above with respect to FIG. 1). Data for identifying the macros on the timing path and the apportionment parameters of each macro is available from the netlist.

At step 235, the computer program product determines a distribution of the slack based upon the apportionment parameters from step 230. For example, the slack may be distributed as described above with respect to FIG. 1. More specifically, the slack may be distributed amongst the macros according to a linear proportion of the apportionment parameter per macro on the timing path, although any suitable distribution scheme can be used within the scope of the invention.

At step 240, the computer program product adjusts the timing assertions of the macros based upon the distribution from step 235. For example, the arrival and/or departure times of the signal at the respective macros may be changed according to the slack distribution from step 235 (e.g., as described above with respect to FIG. 1).

At step 245, the computer program product determines whether the current pin is the last pin of the current macro. Data for making this determination is available from the netlist. If the current pin is not the last pin, then the process returns to step 220, where the next pin of the current macro is identified for processing. However, if at step 245 it is determined that the current pin is the last pin of the current macro, then the process proceeds to step 250.

At step 250, the computer program product determines whether the current macro is the last macro. Data for making this determination is available from the netlist. If the current macro is not the last macro, then the process returns to step 215, where the next macro is identified for processing. However, if at step 250 it is determined that the current macro is the last macro, then the process proceeds to step 255.

At step 255, the computer program product generates a new set of timing assertions for all of the macros. The new set of timing assertions is based upon the one or more adjustments made at step 240 of the iterative process. The generating may include, for example, storing the timing assertions as part of the netlist, storing the timing assertions as data in memory, displaying, printing, etc.

Optionally, at step 260, the circuit is re-designed based upon the new timing assertions from step 255. For example, a conventional design tool may be used to alter the physical aspects of the macros of the circuit based upon the original netlist and the new set of timing assertions. As the new set of timing assertions are based upon parameters that influence power performance, the new circuit design is optimized for both power and timing.

While the invention has been described in terms of embodiments, those skilled in the art will recognize that the invention can be practiced with modifications and in the spirit and scope of the appended claims.

What is claimed:

1. A method for generating a new set of timing assertions associated with a design of a circuit, comprising:
   generating a hierarchical netlist of the design using a design tool executing on a computer, wherein the design includes a plurality of macros;
   designating one of the plurality of macros as a current macro for processing;
   designating one of a plurality of pins of the current macro as a current pin for processing;
   determining a worst timing path that passes through the current pin;
   determining a slack of the worst timing path;
   determining a subset of macros of the plurality of macros, wherein the subset of macros includes ones of the plurality of macros that are associated with and on the worst timing path;
   determining a respective apportionment parameter for each respective macro of the subset of macros, wherein the respective apportionment parameter for each said respective macro comprises a sum of gate widths of all gates contained within said respective macro;
   determining a distribution of the slack amongst each said respective macro of the subset of macros based upon the respective apportionment parameter associated with each said respective macro;
   adjusting timing assertions for each said respective macro of the subset of macros based upon the determined distribution of the slack, wherein the timing assertions define arrival times or departure times of a signal;
   generating a new set of timing assertions for all of the plurality of macros of the design based upon the adjusting the timing assertions; and
   re-designing the circuit based on the generated new set of timing assertions, wherein the re-designing comprises altering physical aspects of the plurality of macros of the circuit based on the hierarchical netlist and the generated new set of timing assertions.

2. The method of claim 1, further comprising altering power consumption or power dissipation of the design by modifying the design based upon the new set of timing assertions.

3. The method of claim 1, wherein the determining the distribution of the slack amongst each said respective macro of the subset of macros based upon the respective apportionment parameter associated with each said respective macro comprises:
   distributing the slack amongst each said respective macro of the subset of macros according to a linear proportion of the respective apportionment parameter per macro on the worst timing path.

4. A method for generating a new set of timing assertions associated with a design of a circuit, comprising:
   generating a hierarchical netlist of the design using a design tool executing on a computer, wherein the design includes a plurality of macros;
   designating one of the plurality of macros as a current macro for processing;
   designating one of a plurality of pins of the current macro as a current pin for processing;
   determining a worst timing path that passes through the current pin;
   determining a slack of the worst timing path;
   determining a subset of macros of the plurality of macros, wherein the subset of macros includes ones of the plurality of macros that are associated with and on the worst timing path;
   determining a respective apportionment parameter for each respective macro of the subset of macros;
   determining a distribution of the slack amongst each said respective macro of the subset of macros based upon the respective apportionment parameter associated with each said respective macro;
   adjusting timing assertions for each said respective macro of the subset of macros based upon the determined distribution of the slack, wherein the timing assertions define arrival times or departure times of a signal;
   generating a new set of timing assertions for all of the plurality of macros of the design based upon the adjusting the timing assertions;
   re-designing the circuit based on the generated new set of timing assertions, wherein the re-designing comprises altering physical aspects of the plurality of macros of the circuit based on the hierarchical netlist and the generated new set of timing assertions; and
   wherein the respective apportionment parameter for each said respective macro comprises at least one of a sum of gate widths of all gates contained within said respective macro, a total physical size of said respective macro, a number of timing paths per said respective macro, a activity factor per said respective macro, a power consumption per said respective macro, a power budget per said respective macro, a algebraic difference of power budget and power consumption per said respective macro, a number of high threshold voltage transistors per said respective macro, a number of low threshold voltage transistors per said respective macro, and a amount of positive slack associated with each macro.

\* \* \* \* \*